(12) United States Patent
Nakamura

(10) Patent No.: US 7,432,651 B2
(45) Date of Patent: Oct. 7, 2008

(54) ORGANIC EL ELEMENT, ORGANIC EL DISPLAY DEVICE AND METHOD FOR FABRICATING THEM

(75) Inventor: Nobuhiro Nakamura, Yokohama (JP)

(73) Assignee: OPTREX Corporation, Tokyo (JP)

( * ) Notice: Subject to any disclaimer, the term of this patent is extended or adjusted under 35 U.S.C. 154(b) by 25 days.

(21) Appl. No.: 11/297,461

(22) Filed: Dec. 9, 2005

(65) Prior Publication Data
US 2006/0152141 A1    Jul. 13, 2006

(30) Foreign Application Priority Data
Dec. 14, 2004    (JP)    ............... 2004-361794

(51) Int. Cl.
*H01J 1/62*    (2006.01)
*H01J 63/04*    (2006.01)
*H01L 51/40*    (2006.01)

(52) U.S. Cl. .................. 313/506; 313/504; 445/24; 428/690

(58) Field of Classification Search ......... 313/504–506, 313/498, 483; 445/24–25; 428/690
See application file for complete search history.

(56) References Cited

U.S. PATENT DOCUMENTS

| | | | |
|---|---|---|---|
| 6,522,067 B1 * | 2/2003 | Graff et al. | 313/512 |
| 6,573,650 B2 * | 6/2003 | Aoki et al. | 313/503 |
| 6,608,333 B1 * | 8/2003 | Lee et al. | 257/98 |
| 6,689,492 B1 * | 2/2004 | Yamazaki et al. | 428/690 |
| 6,879,099 B2 * | 4/2005 | Kihara et al. | 313/504 |
| 2005/0007014 A1 * | 1/2005 | Kurata | 313/504 |
| 2005/0012445 A1 * | 1/2005 | Yamazaki et al. | 313/500 |
| 2005/0073243 A1 * | 4/2005 | Yamazaki et al. | 313/498 |

* cited by examiner

*Primary Examiner*—Nimeshkumar D. Patel
*Assistant Examiner*—Anne M Hines
(74) *Attorney, Agent, or Firm*—Oblon, Spivak, McClelland, Maier & Neustadt, P.C.

(57) ABSTRACT

An organic EL panel 114 includes an anode 144, which is a transparent and conductive, a cathode 134, and an organic EL multilayer film 124 sandwiched between the anode 144 and the cathode 134, wherein the cathode 134 has an interface with the organic EL multilayer film 124, the interface comprising a black material. An organic EL display device includes such an organic EL element.

10 Claims, 7 Drawing Sheets

Luminous light
External light

Condition 1  Ar 50 sccm, N₂ 50 sccm

| Sputtering period (min) | N (atom%) | O (atom%) | Al (atom%) |
|---|---|---|---|
| 0.5 | 29.86 | 28.61 | 41.53 |
| 1 | 34.2 | 22.83 | 42.97 |
| 3 | 40.83 | 13.03 | 46.14 |

| | ΔL* | Δa* | Δb* |
|---|---|---|---|
| AlN#1 | -5.92 | 0.45 | 0.45 |

| | ΔL* | Δa* | Δb* |
|---|---|---|---|
| White sheet | 93.36 | -1.66 | -2.41 |

| | ΔL* | Δa* | Δb* |
|---|---|---|---|
| Glass material | -1.88 | -0.59 | 0.15 |

Condition 2  Ar 80 sccm, N₂ 20 sccm

| Sputtering period (min) | N (atom%) | O (atom%) | Al (atom%) |
|---|---|---|---|
| 0.5 | 33.31 | 22.06 | 44.63 |
| 1 | 36.6 | 17.21 | 46.19 |

|  | ΔL* | Δa* | Δb* |
|---|---|---|---|
| AlN#2 | -24.57 | 3.20 | 17.07 |

Condition 3  Ar 90 sccm, N₂ 10 sccm

| Sputtering period (min) | N (atom%) | O (atom%) | Al (atom%) |
|---|---|---|---|
| 0.5 | 14.5 | 41.98 | 38.42 |
| 1 | 16.42 | 39.08 | 40.5 |
| 3 | 18.92 | 31.52 | 47.23 |

|  | ΔL* | Δa* | Δb* |
|---|---|---|---|
| AlN#3 | -68.49 | 2.56 | 2.03 |

US 7,432,651 B2

ORGANIC EL ELEMENT, ORGANIC EL DISPLAY DEVICE AND METHOD FOR FABRICATING THEM

FIELD OF THE INVENTION

The present invention relates to an organic EL element, an organic EL display device, and a method for fabricating them.

DISCUSSION OF BACKGROUND

An organic electroluminescence (hereinbelow, abbreviated to EL) element has been recently brought to attention as a light-emitting element. Research has been carried out on an organic EL display device using such an organic EL element, as an alternative to a liquid crystal display device (LCD), a CRT and other display devices. In particular, such an organic EL element has been brought to attention as a light-emitting element for realizing a thin display device. An example of such an organic EL display device is shown in FIG. 7.

As shown in FIG. 7, an organic EL display device 900 includes an organic EL panel 901. The organic EL panel 901 has an organic EL element 902 including a laminated structure, wherein an organic EL multilayer film 124 is sandwiched between an anode 144 and a cathode 911, the organic EL multilayer film containing an organic light-emitting compound. When a voltage is applied across the anode 144 and the cathode 911, holes and electrons are respectively injected from the anode 144 and from the cathode 911 into the organic EL multilayer film 124, and holes and electrons are recombined therein. Molecules of the organic light-emitting compound contained in the organic EL multilayer film 124 are excited by energy generated by the recombination. In the process wherein the excited molecules are deactivating to the ground state, light radiation is caused. The organic EL element 902 is an emissive element making use of this light radiation.

The organic EL multilayer film 124 contains at least an organic layer, which emits light by recombination of holes and electrons, which is called a light-emitting layer, and which has a single layer comprising a light-emitting layer or a multilayered structure containing a hole injection layer, a hole transport layer, an electron transport layer, an electron injection layer and the like as required.

In general, the organic EL panel 901 is fabricated by sequentially laminating, on a glass substrate 111, a transparent electrode made of, e.g., ITO (Indium Tin Oxide) to serve as the anode 144, the organic EL multilayer film 124 and an electrode made of, e.g., aluminum to serve as the cathode 911 so as to form the organic EL element 902 in an laminated structure; and hermetically disposing a concave opposed substrate 112 on the substrate 111 through a ultraviolet curing adhesive 113, the concave opposed substrate comprising a glass substrate and the like, the glass substrate covering the laminated structure.

The organic EL panel 901 has a circular polarizer 912 disposed on a viewer side surface thereof, the circular polarizer comprising a linear polarizer 921 and a ¼λ plate 922. External light, which comes into the organic EL panel 901, is prevented from being reflected on the electrodes to lower the contrast given by the organic EL display device 900. Specifically, the external light passes through the linear polarizer 921 of the circular polarizer 912 to be transformed into linearly polarized light, and the linearly polarized light is transformed into circularly polarized light by the ¼λ plate 922. The circularly polarized light is reflected by a surface of the cathode 911 after passing through the anode 144 as the transparent electrode and the organic EL multilayer film 124.

The reflected circularly polarized light passes through the ¼λ plate 922 to be transformed into linearly polarized light. The linearly polarized light has a polarizing direction substantially perpendicular to the polarization axis of the linear polarizer 921. For this reason, the external light reflected in the organic EL panel 901 cannot pass through the linear polarizer 921. Thus, external light, which comes into the organic EL panel 901, can be prevented from going out from a viewer side.

JP-A-2003-115383 discloses an example of an organic EL display device, which uses a polarizer to improve contrast. In the organic EL display device disclosed in this patent document, the polarizer, which is disposed on a light-emitting surface, absorbs external light, improving contrast.

SUMMARY OF THE INVENTION

As stated above, conventional organic EL display devices have a circular polarizer disposed as an antireflection coating therein. Accordingly, the number of the parts is increased, and the circular polarizer absorbs light emitted from the organic EL element 902, decreasing light-use efficiency.

From this viewpoint, it is an object of the present invention to provide an organic EL element, an organic EL display device, and a method for fabricating them, which are capable of effectively restraining reflection of external light without using a polarizer for antireflection of external light.

According to a first aspect of the present invention, there is provided an organic EL element comprising a first electrode, the first electrode being transparent and conductive; a second electrode; and an organic EL multilayer film disposed between the first electrode and the second electrode; wherein the second electrode has an interface with the organic EL multilayer film, the interface being made of a black material. By this arrangement, external light is absorbed by the interface of the second electrode with the organic EL multilayer film. Accordingly, it is possible to effectively restrain external light from being reflected without using a polarizer for antireflection of external light.

According to a second aspect of the present invention, the black material comprises a nitrogen-containing aluminum compound in the organic EL element.

According to a third aspect of the present invention, the second electrode includes a laminated structure comprising a black interface film forming the interface with the organic EL multilayer film; and a conductive film having a higher conductivity than the black interface film, or a structure with nitrogen contents sequentially changed from the black interface film toward the conductive film in the organic EL element.

According to a fourth aspect of the present invention, the black interface film comprises a nitrogen-containing aluminum compound, and the conductive film comprises aluminum in the organic EL element.

According to a fifth aspect of the present invention, the nitrogen-containing aluminum compound has a nitrogen content of from 10 to 25 atom % in the organic EL element.

According to a sixth aspect of the present invention, the nitrogen-containing aluminum compound has a thickness of 50 to 250 nm in the organic EL element.

According to a seventh aspect of the present invention, there is provided an organic EL display device using the organic EL element defined in any one of the first to sixth aspects. Since this arrangement allows external light to be absorbed by the interface of the second electrode with the organic EL multilayer film, it is possible to effectively restrain external light from being reflected without using a polarizer for antireflection of external light.

According to an eighth aspect of the present invention, there is provided a method for fabricating an organic EL element, comprising forming a first electrode on a substrate, the first electrode being transparent and conductive; forming an organic EL multilayer film on a side of the first electrode remote from the substrate; and forming a second electrode on a side of the organic EL multilayer film remote from the substrate, the second electrode having a black interface with the organic EL multilayer film.

According to a ninth aspect of the present invention, the step for forming the second electrode comprises forming the black interface by accumulating a nitrogen-containing aluminum compound by use of a sputtering method using a mixed gas containing nitrogen and an inert gas in the method for fabricating an organic EL element.

According to a tenth aspect of the present invention, the step for forming the second electrode further comprises forming an aluminum film on a side of the black interface remote from the organic EL multilayer film by use of a sputtering method in the method for fabricating an organic EL element.

According to an eleventh aspect of the present invention, there is provided a method for fabricating an organic EL display device, comprising forming organic EL elements by use of the method defined by any one of the eighth to tenth aspects; and bonding an opposed substrate to the substrate and encapsulating the organic EL elements in a space between the substrate and the opposed substrate.

In accordance with the present invention, it is possible to provide an organic EL element, an organic EL display device, and a method for fabricating them, which are capable of effectively restraining reflection of external light without using a polarizer for antireflection of external light.

DETAILED DESCRIPTION OF THE PREFERRED EMBODIMENTS

Now, embodiments, to which the present invention is applicable, will be described. The following explanation will be made only for the purpose of describing embodiments of the present invention, and the present invention is not limited to the embodiments described below.

Figure 1:
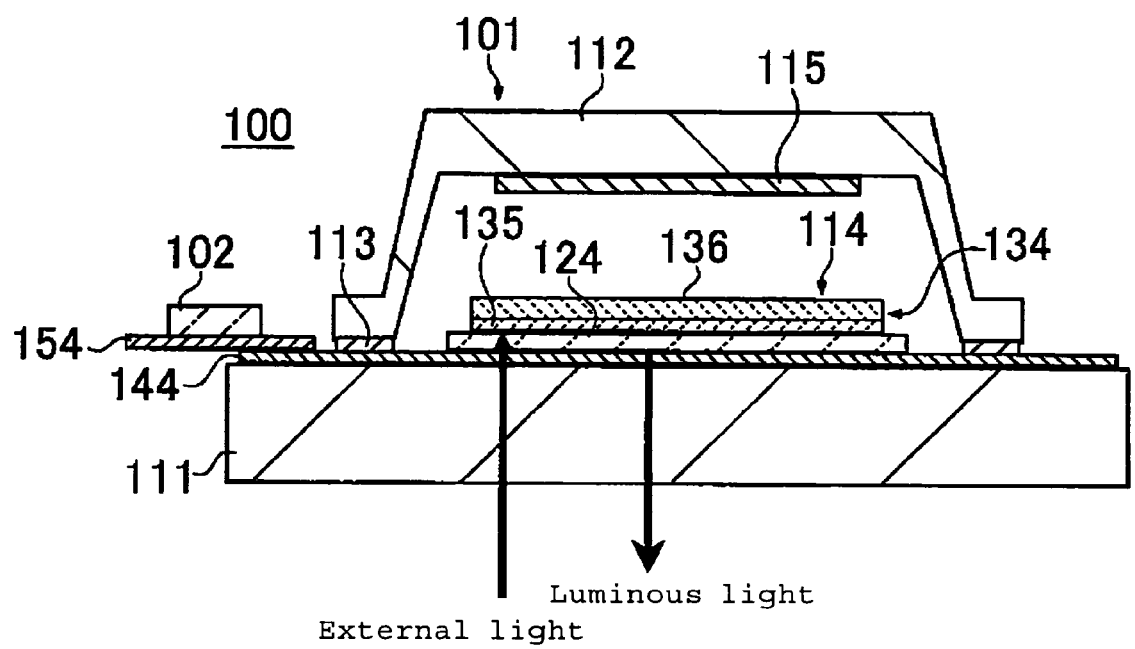
FIG. 1 is a cross-sectional view schematically showing the organic EL display device according to an embodiment of the present invention.
Figure 7:
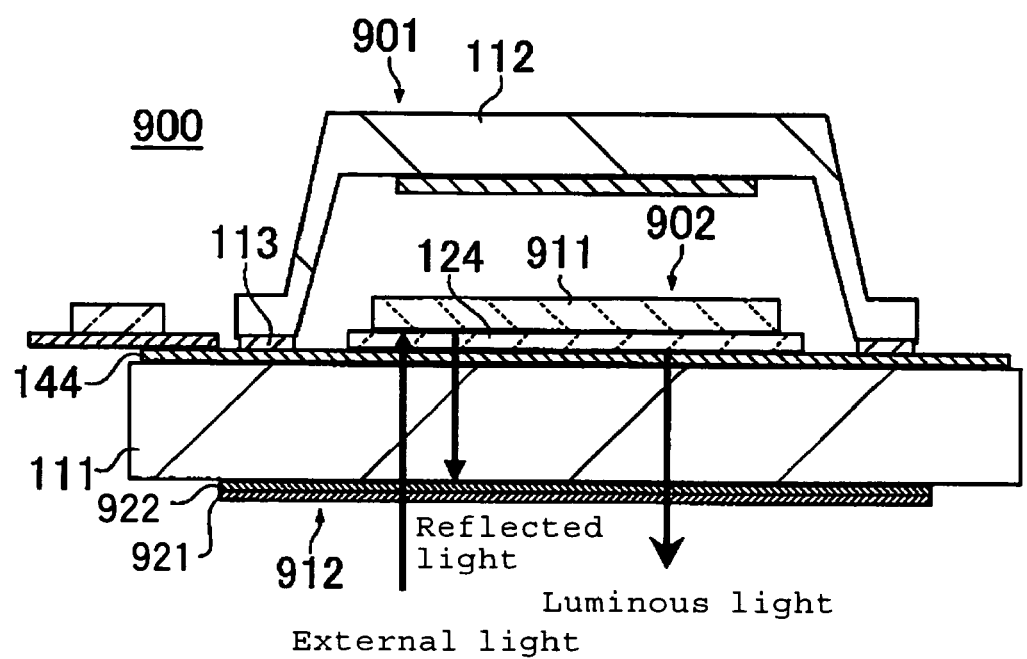
FIG. 7 is a cross-sectional view schematically showing a conventional organic EL display device.

First, the structure of the organic EL display device according to a preferred embodiment of the present invention will be explained based on FIG. 1. FIG. 1 is a cross-sectional view schematically showing the structure of this organic EL display device. Please note that FIG. 1 schematically shows the structure of the organic EL display device but does not exactly show a detailed structure of an actual organic EL display device. Parts similar to those of the organic EL display device shown in FIG. 7 are indicated by identical reference numerals in FIG. 1.

As shown in FIG. 1, the organic EL display device 100 according to this embodiment includes an organic EL panel 101 and a driving circuit 102. This organic EL panel 101 includes a substrate 111, an opposed substrate 112, a sealing material 113, an organic EL element 114 and a desiccant 115.

The substrate 111 is a transparent substrate made of glass, a resin or the like. The opposed substrate 112 is disposed so as to confront the substrate 111. The opposed substrate 112 may be made of metal, such as stainless steel, aluminum, or an alloy of aluminum. The opposed substrate 112 may be made of one selected from among stainless steel, aluminum, an alloy of stainless steel or aluminum, glass, and an acrylic resin, or a combination of at least two materials among them.

The sealing material 113 firmly connects the substrate 111 and the opposed substrate 112 to keep the space between both substrates hermetic. In other words, the sealing material 113 seals the substrate 111 and the opposed substrate 112 to form an encapsulated space (area) between the substrate 111 and the opposed substrate 112. By this arrangement, moisture or oxygen is prevented from invading into the space between the substrate 111 and the opposed substrate 112. Additionally, it is typical that nitrogen is sealed in the encapsulated space to prevent moisture or oxygen from invading thereinto. The sealing material 113 may be made of, e.g., an epoxy resin adhesive having low permeability for, e.g., moisture.

The organic EL element 114 is formed on the substrate 111 and is disposed in the encapsulated space between the substrate 111 and the opposed substrate 112. The organic EL element 114 is formed at each of plural positions, serving as an active area. In other words, each pixel is formed at a position where organic EL elements 114 are disposed.

The organic EL element 114 includes an anode 144, an organic EL multilayer film 124 and a cathode 134. The organic EL multilayer film 124 is disposed between the anode 144 and the cathode 134. The anode 144 is formed on a side of the organic EL element 114 close to the substrate 111, i.e., a viewer side. In other words, the anode 144 is one of the electrodes of the organic EL element 114 and serves as either one of a first electrode and a second electrode. The anode 144 also serves as the lowest layer of the organic EL element 144 on the substrate 111 in FIG. 1. The anode 144 is made of a transparent conductive thin film. An example of the anode material for forming the anode 144 is ITO.

The anode 144 has an insulating film (not shown) made of polyimide disposed thereon (a side of the anode remote from the substrate 111 or an opposite viewer side) to prevent the anode 144 and the cathode 134 from being short-circuited. The unshown insulating film has an apertural area formed at a position, where the cathode 134 crosses over the anode 144. At the apertural area, the organic EL element 114 is formed, serving as a pixel of the organic EL panel 100.

A portion of the anode 144, which is exposed in the apertural area of the insulating film, has the organic EL multilayer film 124 formed thereon. The organic EL multilayer film 124 is also disposed on the insulating film. The organic EL multilayer film 124 typically has a laminated structure wherein a hole injection layer, a hole transport layer, a light emitting layer, an electron injection layer and the like are laminated in this order from a side of the anode 144. For example, the hole injection layer and the hole transport layer may be made of copper phthalocyanine (CuPc) and N,N'-di(naphthalen-1-yl)-N,N'-diphenyl-benzidine (α-NPD), respectively. In one example, the light emitting layer and the electron injection layer may be made of tris(8-quinolinorato)aluminum (Alq3) and LiF, respectively. The organic EL multilayer film 124 may have a different multilayered structure from the laminated structure stated above or a single-layered structure.

The cathode 134 is formed on a side of the organic EL multilayer film 124 remote from the substrate (the opposite viewer side) and is disposed as the highest layer of the organic EL element 114. In other words, the cathode 134 is one of the electrodes of the organic EL element 114 and serve as either one of the first electrode and the second electrode. When the anode 144 serves as the first electrode of the organic EL element 114, the cathode 134 serves as the second electrode. When the anode 144 serves as the second electrode of the organic EL element 114, the cathode serves as the first electrode. Although not shown, separators, which may be made of, e.g., a novolac resin, are provided in order to separate the cathode 134 from another cathode.

The cathode 134 according to this embodiment has a black interface film 135 in contact with the organic EL multilayer film 124. In other words, the interface of the cathode 134 with the organic EL multilayer film 124 is made of a black material. By this arrangement, external light, which enters into the viewer side of the organic EL display device 100, is absorbed by the black interface of the cathode 134. Accordingly, it is possible to prevent external light from being reflected without provision of a polarizer since the external light entering into the organic EL display device can be prevented from going out of the organic EL display device.

Additionally, the cathode 134 has a laminated structure as shown in FIG. 1. The cathode 134 has a conductive film 136 disposed as an upper layer on the black interface film 135 forming the interface with the organic EL multilayer film 124, i.e., on a side of the black interface film 135 remote from the substrate 111 (the opposite viewer side). The conductive film 136 has a higher conductivity than the black interface film 135. Thus, it is possible to increase the conductivity of the cathode 134 while preventing external light from being reflected. The electrode may be configured to have a structure with composition ratios sequentially changed, wherein the content of nitrogen is sequentially changed from the black interface film 135 toward the conductive film 136.

It is preferred that the black interface film 135 of the cathode 134 be made of a nitrogen-containing aluminum compound (this compound will be abbreviated to AlN in some of the drawings). This is because the cathode 134 can not only ensure a required conductivity but also realize a black interface in this case. Such a nitrogen-containing aluminum compound can easily adjust the degrees of black and conductivity by changing the content of N. Thus, it is possible to easily ensure an adequate degree of black and an adequate conductivity. The degree of black means the level of "darkness" and shows how dark the interface film is. The nitrogen-containing aluminum compound for forming the cathode 134 may contain an element, such as oxygen, in addition to nitrogen and aluminum.

As the content of N increases, the conductivity of the nitrogen-containing aluminum compound decreases. As the content of N decreases, the reflectance of the compound increases. As the content of N increases, the compound is more transparent. The contents of N of the nitrogen-containing aluminum compound for forming the cathode 134 is preferably from 10 to 25 atom % in order to obtain a conductivity required for the electrode and a degree of black required for antireflection. From the viewpoint of further increasing the degree of black, the content of N is more preferably from 12 to 20 atom %, more preferably from 14 to 19 atom %.

It is preferred that the black interface film 135 have a film thickness of from 50 to 250 nm. When the film thickness is not larger than 50 nm, the cathode 134 per se is glossy. When the film thickness is not smaller than 250 nm, the resistance of the cathode 134 increases and the driving voltage rises.

The material of the conductive film 136 laminated on the black interface film 135 is preferably aluminum. Aluminum has a high conductivity. Additionally, when the black interface film 135 is formed from a nitrogen-containing aluminum compound, it is possible to simplify the production process for the cathode 134. Further, it is possible to provide the electrode with a structure with composition ratios sequentially changed, by sequentially performing film deposition from the black interface film 135 to the conductive film 136 while controlling the partial pressure of N (the partial pressure of nitrogen) during film deposition. Although the conductivity of the nitrogen-containing aluminum compound is decreased as the content of nitrogen increases, it is possible to maintain the conductivity of the cathode 134 at a higher level by adopting such a laminated structure. Thus, it is possible to obtain substantially the same conductivity as the conventional cathode 911 made of aluminum.

The desiccant 115 is disposed on a surface of the opposed substrate 112 confronting the organic EL element 114 in the encapsulated space. The desiccant 115 absorbs moisture, which has entered into the encapsulated space between the substrate 111 and the opposed substrate 112. The desiccant 115 serves to restrain the organic EL element 114 from being deteriorated by moisture or oxygen and to provide the organic EL element with a stable light emission characteristic.

The desiccant 115 may be made of a material, which is creamy or gelatinous and adhesive to a surface to apply, for example. This type of desiccant 115 is obtainable by mixing a certain amount of absorbent into an inert liquid, such as fluorinated oil, or an inert gelatinous substance, such as fluorinated gel. The desiccant 115 is also obtainable by mixing a certain amount of absorbent into an inert liquid, such as silicone oil, or an inert gelatinous substance, such as silicone gel. The absorbent may be made of a material, which can physically or chemically absorb moisture, such as activated alumina, molecular sieves, calcium oxide or barium oxide.

The organic EL display device 100 according to this embodiment includes the driving circuit 102 in addition to the organic EL panel 101 having such a structure. The driving circuit 102 is connected to each of the anode 144 and the cathode 134. In FIG. 1, only the driving circuit 102, which is connected to the anode 144 through an FPC (Flexible Print Circuit) 154, is shown as an example. Although a terminal, which is an extension of the anode 144, is connected to the FPC 154 in FIG. 1, it is typical that the anode 144 and the FPC 154 are connected each other through an anode supplemental wire formed on the substrate 111. The anode supplemental wire is typically made of a metal material having a low resistance, such as aluminum or an aluminum-based alloy.

Although only the anode 144 is shown to be connected to the anode supplemental wire in the organic EL display device 100 according to this embodiment, the cathode 134 may be connected to a cathode supplemental wire. The anode 144 and the cathode 134 may be connected to their respective supplemental wires.

The organic EL display device 100 thus constructed is driven as stated below. The driving circuit 102 supplies a current to the organic EL element 114 through the anode 144 and the cathode 134. When a voltage is applied between the anode 144 and the cathode 134, holes and electrons are injected into the organic EL multilayer film 124 from the anode 144 and the cathode 134, respectively. Holes and electrons, which has been injected, are recombined, and molecules of the organic light-emitting compound in the organic EL multilayer film 124 are excited by energy generated by the recombiniation. In the process wherein the excited molecules are deactivating to the ground state, the organic EL multilayer film 124 emits light. Thus, the organic EL element 114 emits light, causing the organic EL display device 100 to display a desired image.

Figure 2:
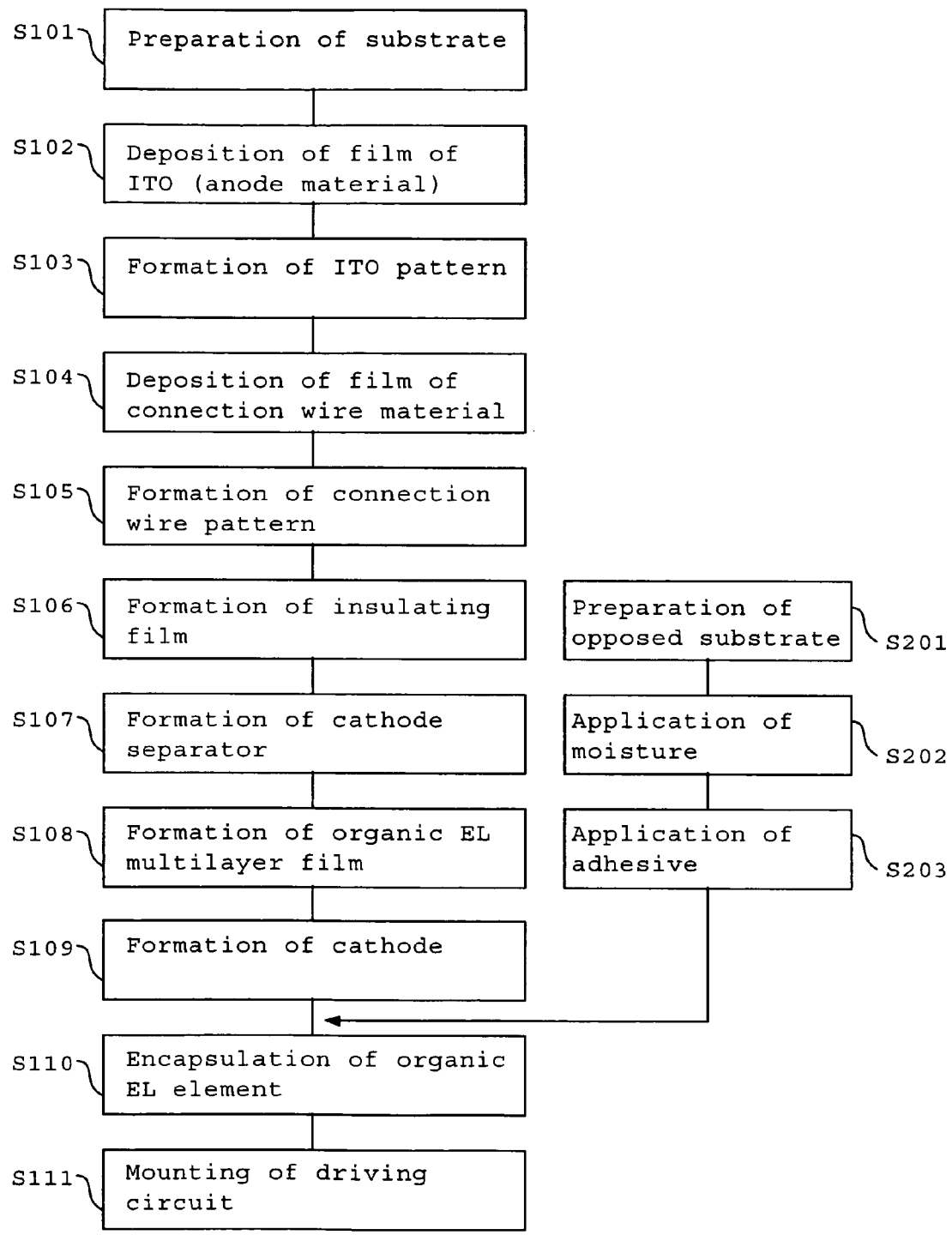
FIG. 2 is a flowchart showing a process for fabricating the organic EL display device according to an embodiment.

Next, a method for fabricating the organic EL display device 100 according to the present invention will be described, referring to FIG. 2. FIG. 2 is a flowchart showing a fabrication process for the organic EL display device 100. First, explanation will be made about a process for fabricating a panel with plural organic EL elements 114 formed on a substrate 111.

As shown in FIG. 2, a substrate 111 to form the organic EL elements 114 thereon is prepared (S101). An anode material is deposited as a film on the substrate 111 (S102). The anode material is typically made of ITO. Examples of the film deposition method are a vapor deposition method and a sputtering method. The anode material is uniformly deposited as a film on the substrate 111 by such a film deposition method. After that, the anode material is patterned so as to have a desired pattern shape by photolithography or etching (S103), and the patterned anode material serves as anodes 144.

A supplemental wire material, which is not shown in FIG. 1, is deposited as a film on the patterned anodes 144 (S104). Examples of the film deposition for the supplemental wire material are a vapor deposition method and a sputtering method. In order to improve adherence with a foundation layer or to avoid corrosion, a laminated structure may be provided wherein a barrier layer made of titanium nitride (TiN) or chromium (Cr) is formed as an upper or lower layer for an aluminum film. The barrier layer may be formed by a vapor deposition method or a sputtering method.

The supplemental wire material is patterned by photolithography or etching, forming a desired supplemental wire pattern (S105). Etching is carried out, using an etching solution comprising a mixed solution of phosphoric acid, acetic acid, nitric acid or the like. The anode material and the supplemental wire material may be sequentially patterned after the anode material and the supplemental wire material are sequentially deposited as a film.

The supplemental wire material is deposited as a film on the patterned anodes 144, forming anode supplemental wires. The formation of the supplemental wires is not limited to the anodes 144. A supplemental wire material may be deposited as a film on cathodes 134, forming cathode supplemental wires. Supplemental wires may be formed with respect to the anodes 144 and the cathodes 134.

An insulating film (which is not shown in FIG. 1) may be formed on the anodes 144 (S106). The unshown insulating film is deposited as a film by spin coating, and the deposited insulating film is formed so as to have a desired pattern by a technique, such as a photolithographic method. The insulating film (not shown in FIG. 1) has apertural areas formed therein at positions, where the anodes 144 and the cathodes 134 intersect each other in a plan view (i.e., where pixels are formed).

In order to separate the cathodes 134 from one another, separators are formed (S107). The cathode separators are formed by spin-coating a novolac resin and patterning the coated novolac resin by a photolithographic process, followed by subjecting the patterned novolac resin to photoreaction, for example. It is preferred that a negative photosensitive resin be used in order to provide the cathode separators with an inverted tapered structure. By providing the cathode separators with such a structure, it is possible to separate the cathodes from one another since portions of the cathodes 134, which are shaded from the viewpoint of a vapor deposition source when depositing the cathode 134 in a vapor process, are not affected by vapor deposition. Additionally, oxygen plasma or ultraviolet light may be irradiated for surface modification of portions of the ITO film (anodes 144) exposed in the apertural areas.

The organic EL multilayer films 124 are laminated on the insulating film and on the anodes 144 formed in the apertural areas of the insulating film (not shown in FIG. 1) by a vapor deposition method, an application method or the like (S108). The cathodes 134 are formed on the laminated organic EL multilayer films 124 (S109). The cathodes 134 may be formed by physical vapor deposition (PVD), such as a sputtering method. When a black interface film 135 is formed of a nitrogen-containing aluminum compound, the black interface film 135 may be formed by sputtering aluminum in a mixed gas comprising nitrogen and argon.

When a sputtering method is used, it is easy to change the composition ratios of nitrogen in the nitrogen-containing aluminum compound since it is easy to change the introduction amount of a nitrogen gas. When the conductive film 136 is made of aluminum, the conductive film may be formed by sputtering aluminum in an argon gas. Accordingly, it is possible to simplify the fabrication process by providing the cathodes 134 with a laminated structure comprising a nitrogen-containing aluminum compound and aluminum. By performing sequential film deposition from the black interface film 135 to the conductive film 136 while controlling a partial pressure of N during film deposition, it is possible to provide the electrodes with a structure with composition ratios sequentially changed.

As stated above, the organic EL elements 114 are formed by laminating the anodes 144, the insulating film not shown in FIG. 1, the organic EL multilayer films 124 and the cathodes 134. By these steps of from S101 to S109, the panel is fabricated so as to have the plural organic EL elements 114 formed on the substrate 111.

Next, explanation will be made about a process for preparing an opposed substrate 112 for encapsulating the organic EL elements 114. As shown in FIG. 2, the opposed substrate 112 is prepared (S201), and a desiccant 115 is disposed in a desired amount on the opposed substrate 112. For example, the desiccant 115 is applied on the opposed substrate 112 in a dry atmosphere using dry air or an inert gas with moisture removed as much as possible (such as dry nitrogen) (S202).

Subsequently, explanation will be made about a process for encapsulating the organic EL elements 114. A sealing material 113 is applied on the opposed substrate 112, and the substrate 111 and the opposed substrate 112 are fixed together (S203). The sealing material 113 is applied to a portion of the opposed substrate outside the desiccant 115 so as to surround the entire periphery of an active area by a dispenser. The opposed substrate 112 with the desiccant 115 disposed thereon, and the substrate 111 with the organic EL elements 114 formed thereon are bonded together.

After the substrate 111 and the opposed substrate 112 are bonded together, light, such as UV light, is irradiated while applying a pressure on both substrates. By irradiation of light, the sealing material 113 is cured to firmly bond the substrate 111 and the opposed substrate 112. Thus, the space between the substrate 111 and the opposed substrate 112 is encapsulated, completing the fabrication of the organic EL panel 101 (S110).

After that, a driving circuit 102 and the like are mounted to the panel (S111). Specifically, an anisotropic conductive film (ACF) is affixed on a terminal portion on the substrate 111, and the anisotropic conductive film is connected to the FPC 154 with the driving circuit 102 mounted thereon. The organic EL panel 101 thus formed is mounted to a casing, completing the fabrication of the organic EL display device.

Now, other embodiments of the present invention will be described.

Although the black material used for the cathode 134 preferably comprises a nitrogen-containing aluminum compound as stated above, it is acceptable to use, e.g., a chromium oxide (such as CrO or $CrO_2$), or graphite as another material.

Figure 3:
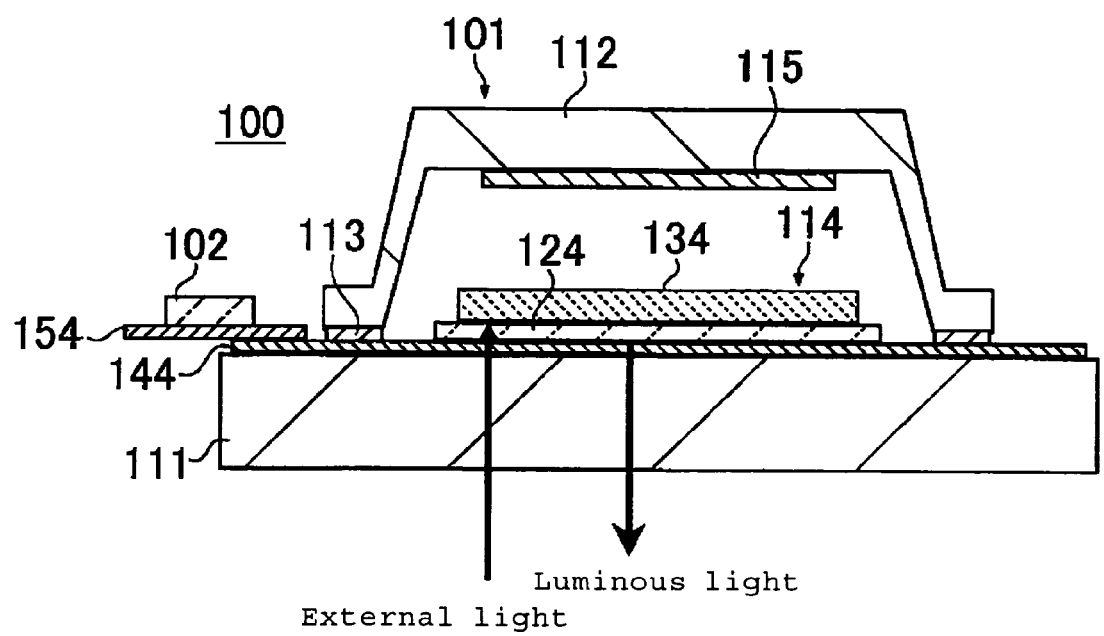
FIG. 3 is a cross-sectional view schematically showing the organic EL display device according to another embodiment of the present invention.

It is preferred that the cathode 134 comprise the black interface film 135 and the conductive film 136 as in the first embodiment. However, as shown in FIG. 3, the entire cathode 134 may be formed of the same black material as long as the cathode can ensure a required conductivity. By adopting this arrangement, it is possible to simplify the fabrication process. In this case, it is preferred that the entire cathode 134 be formed of a nitrogen-containing aluminum compound. It is preferred that the content of N and the film thickness of such a nitrogen-containing aluminum compound be in the same ranges as the first embodiment.

EXAMPLE 1

In Example 1, a multilayered structure comprising a nitrogen-containing aluminum compound and aluminum was formed, and the multilayered structure was compared with a conventional cathode (aluminum electrode) in terms of conductivity. In this example, the nitrogen-containing aluminum compound was deposited as a first film, using a mixed gas of argon and nitrogen, by a sputtering method. Specifically, the nitrogen-containing aluminum compound was deposited so as to have a film thickness of 100 nm by supplying 90 sccm of argon and 10 sccm of nitrogen under a pressure adjusted to 2 E-3 Torr. After that, aluminum was deposited so as to have a film thickness of 150 nm by supplying 100 sccm of argon under a pressure of 2 E-3 Torr.

When Torr as the unit of pressure is converted to the SI unit, the equation of 1 (Torr)=1 (mmHg)≈133.3 (Pa) is established. Additionally, sccm as the unit of gas flow rate is converted to the SI unit, the equation of 1 (sccm)≈1.27 E-2 (Torr·L/sec)≈1.69 E-3 (Pa·m$^3$/sec) is established.

The ionization potential of the deposited film consisting only of the nitrogen-containing aluminum compound was measured and found to be 3.8 eV. This potential is the same value of aluminum, which suggests that this multilayered structure be equal to an aluminum electrode in terms of electron injection from the cathode 134. This reveals that the cathode 134 of the organic EL panel 101 according to the present invention can function as the same way as the conventional aluminum cathodes.

As stated above, the cathode 134 according to the present invention can function as the cathode of the conventional organic EL panels and absorb external light. By adopting the cathode according to the present invention, reflection of external light can be prevented without using a circular polarizer 912.

EXAMPLE 2

The relationship between the content of N and the degree of black of a nitrogen-containing aluminum compound was investigated. Each nitrogen-containing aluminum compound in this example contained oxygen in addition to aluminum and nitrogen. Oxygen did not contribute to the degree of black of the cathodes 134, and only nitrogen contributed to the degree of black of the cathodes 134. Oxygen had no substantial affect on the conductivity of the cathodes 134.

Figures 4A, 4B, 4C, 4D, 4E:
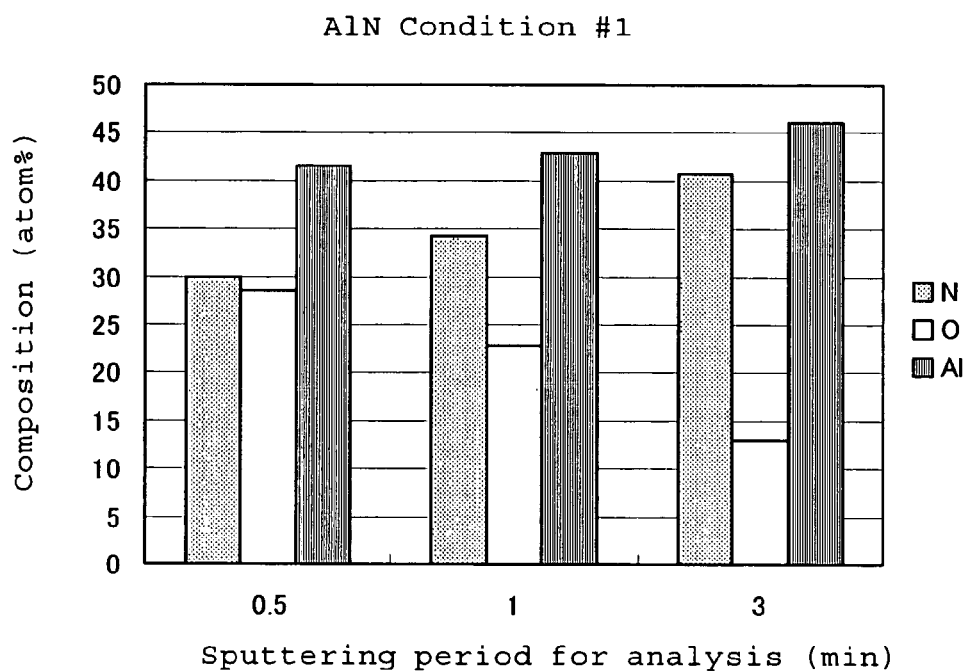
FIGS. 4A to 4E are a graph showing results of analysis of a nitrogen-containing aluminum compound in Condition 1 in Example 2.

In FIGS. 4A to 4E, the results of analysis of each nitrogen-containing aluminum compound according to a mode in this example are shown. As shown in FIG. 4A, each nitrogen-containing aluminum compound was deposited by using a mixed gas comprising argon (50 sccm) and nitrogen (50 sccm) in condition 1. The composition ratios (atom %) of N, O and Al, which were obtained by sputtering for 0.5 min, sputtering for 1 min and sputtering for 3 min under condition 1, were analyzed.

The chromaticity and the luminance of each nitrogen-containing aluminum compound under condition 1 were measured, using a color and color difference meter (CR-200, manufactured by Minolta Co., Ltd.). At that time, a glass substrate with each nitrogen-containing aluminum compound formed thereon was put on a white sheet, and the measurement was made from the side of the glass substrate. The measurement was made at three positions on the glass substrate, and average values were found. FIG. 4C shows an L-value, an a-value and a b-value of each nitrogen-containing aluminum compound under condition 1. FIG. 4D and FIG. 4E show the L-value, the a-value and the b-value of the white sheet, and the L-value, the a-value and the b-value of the glass substrate, respectively, as reference values. The respective values shown in FIGS. 4C to 4E are average values measured at three positions.

According to the results of analysis, the composition ratios of N, O and Al were, 29.86 atom %, 28.61 atom % and 41.53 atom %, respectively, in the case of sputtering for 0.5 min. In the case of sputtering for 1 min, the composition ratios of N, O and Al were 34.2 atom %, 22.83 atom % and 42.97 atom %, respectively. In the case of sputtering for 3 min, the composition ratios of N, O and Al were 40.83 atom %, 13.03 atom % and 46.14 atom %, respectively. The composition ratios of N, O and Al under condition 1 were shown as graphs in FIG. 4B. The cathodes 134 that were formed under condition 1 were able neither to obtain a sufficient degree of black nor to have a sufficient function to absorb external light.

Figures 5A, 5B, 5C:
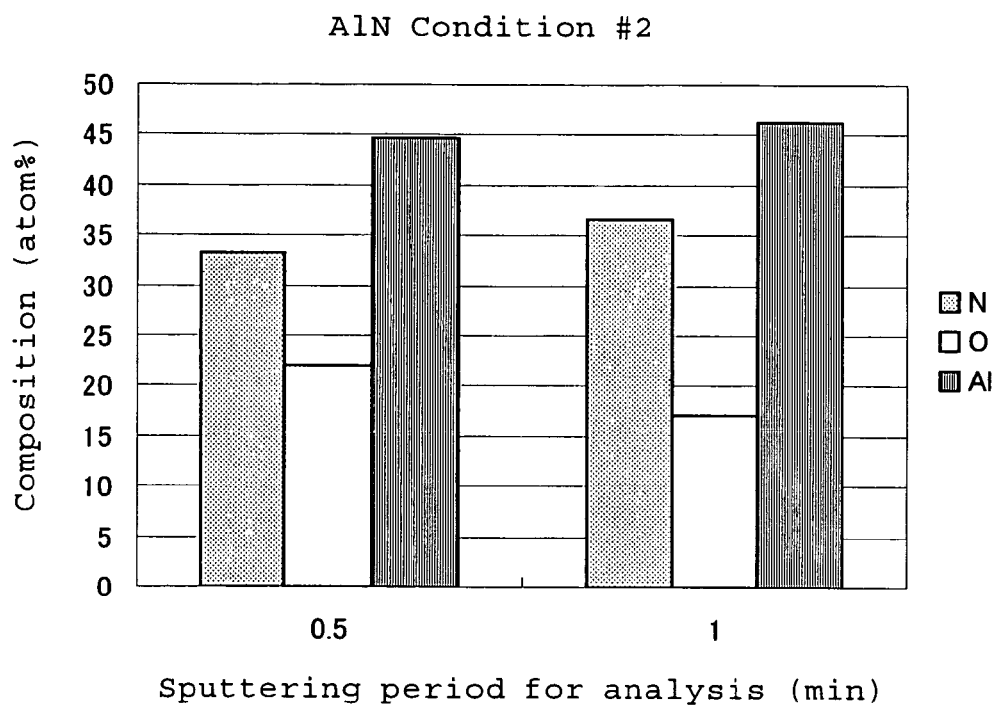
FIGS. 5A to 5C is a graph showing results of analysis of a nitrogen-containing aluminum compound in Condition 2 in Example 2.

FIGS. 5A to 5C show the result of analysis of each nitrogen-containing aluminum compound according to another mode in this example. As shown in FIG. 5A, each nitrogen-containing aluminum compound was deposited by using a mixed gas of argon (80 sccm) and nitrogen (20 sccm) under condition 2. The composition ratios (atom %) of N, O and Al, which were obtained by sputtering for 0.5 min, sputtering for 1 min under condition 2, were analyzed.

Further, the chromaticity and the luminance of each nitrogen-containing aluminum compound under condition 2 were measured by the color and color difference meter as in condition 1. FIG. 5C shows the L-value, the a-value and the b-value of each nitrogen-containing aluminum compound under condition 2. The values shown in FIG. 5C are average values measured at three positions.

According to the result of analysis, the composition ratios of N, O and Al were 33.31 atom %, 22.06 atom % and 44.63 atom %, respectively in the case of sputtering for 0.5 min. In the case of sputtering for 1 min, the composition ratios of N, O and Al were 36.6 atom %, 17.21 atom % and 46.19 atom %, respectively. The composition ratios of N, O and Al under condition 2 are shown as graphs in FIG. 5B. The cathodes 134 that were formed under condition 2 were able neither to obtain a sufficient degree of black nor to have a function to absorb external light.

Figures 6A, 6B, 6C:
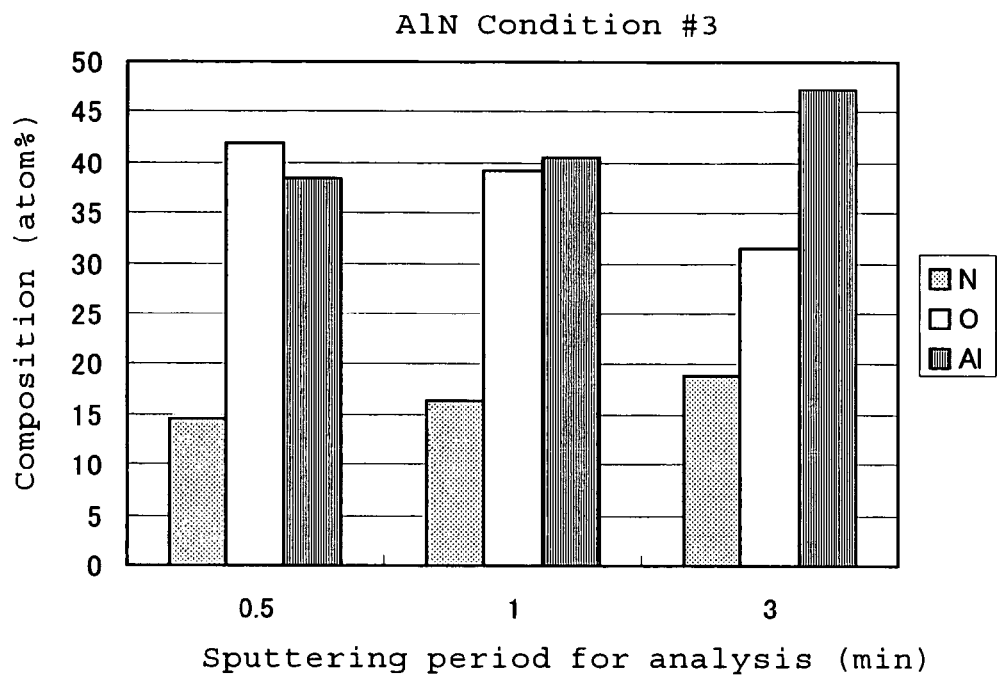
FIGS. 6A to 6C is a graph showing results of analysis of a nitrogen-containing aluminum compound in Condition 3 in Example 2.

FIGS. 6A to 6C show the result of analysis of each nitrogen-containing aluminum compound according to another mode in this example. As shown in FIG. 6A, each nitrogen-containing aluminum compound was deposited by using a mixed gas comprising argon (90 sccm) and $N_2$ (10 sccm) under condition 3. The composition ratios (atom %) of N, O and Al, which were obtained by sputtering for 0.5 min, sputtering for 1 min and sputtering for 3 min under condition 3, were analyzed.

As in the measurement under condition 1, the chromaticity and the luminance of each nitrogen-containing aluminum compound under condition 3 were measured by the color and the color difference meter. FIG. 6C shows the L-value, the a-value and the b-value of each nitrogen-containing aluminum compound under condition 3. The values shown in the table of FIG. 5C are average values measured at three positions.

According to the result of analysis, the composition ratios of N, O and Al were 14.5 atom %, 41.98 atom % and 38.42 atom %, respectively, in the case of sputtering for 0.5 min. In the case of sputtering for 1 min, the composition ratios of N, O and Al were 16.42 atom %, 39.08 atom % and 40.5 atom %, respectively. In the case of sputtering for 3 min, the composition ratios of N, O and Al were 18.92 atom %, 31.52 atom % and 47.23 atom %, respectively. The composition ratios of N, O and Al under condition 3 are shown in graphs in FIG. 6B. The cathodes 134 that were formed under condition 3 were able to obtain a sufficient degree of black and to function to absorb external light in a sufficient way.

Although explanation of the embodiments has been made about a case wherein the present invention is applied to an organic EL display device, it should be noted that devices utilizing the light emission of an organic EL element, such as an organic EL light-emitting device and an organic EL light source device, are contained in the organic EL display device.

The entire disclosure of Japanese Patent Application No. 2004-361794 filed on Dec. 14, 2004 including specification, claims, drawings and summary is incorporated herein by reference in its entirety.

What is claimed is:

1. An organic EL element comprising:
   a first electrode, the first electrode being transparent and conductive;
   a second electrode;
   an organic EL multilayer film disposed between the first electrode and the second electrode; and
   an interface film disposed as an interface between the second electrode and the EL multilayer film, said interface film including a black material that includes a nitrogen-aluminum compound, and a bottom surface of the interface film is on top of a top surface of the EL multilayer film,
   wherein the second electrode includes a laminated structure including the interface film forming the interface with the organic EL multilayer film and a conductive film having a higher conductivity than the interface film, or the second electrode includes a structure with nitrogen contents sequentially changed from the interface film toward the conductive film.

2. The organic EL element according to claim 1, wherein the conductive film comprises aluminum.

3. The organic EL element according to claim 1, wherein the nitrogen-aluminum compound has a nitrogen content of from 10 to 25 atomic %.

4. The organic EL element according to claim 1, wherein the nitrogen-aluminum compound has a thickness of 50 to 250 nm.

5. An organic EL display device using the organic EL element defined in claim 1.

6. A method for fabricating an organic EL element, comprising:
   forming a first electrode on a substrate, the first electrode being transparent and conductive;
   forming an organic EL multilayer film on a side of the first electrode remote from the substrate; and
   forming a second electrode on a side of the organic EL multilayer film remote from the substrate, the second electrode having a black interface with the organic EL multilayer film, the black interface including a nitrogen-aluminum compound, and the forming the second electrode includes forming a laminated structure including the interface film forming the interface with the organic EL multilayer film and a conductive film having a higher conductivity than the interface film, or the forming the second electrode includes forming a structure with nitrogen contents sequentially changed from the interface film toward the conductive film,
   wherein a bottom surface of the black interface is on top of a top surface of the EL multilayer film.

7. The method according to claim 6, wherein the step of forming the second electrode comprises forming the black interface by accumulating a nitrogen-containing compound by use of a sputtering method using a mixed gas containing nitrogen and an inert gas.

8. The method according to claim 7, wherein the step of forming the second electrode further comprises forming an aluminum film on a side of the black interface remote from the organic EL multilayer film by use of a sputtering method.

9. A method for fabricating an organic EL display device, comprising:
   forming organic EL elements by use of the method defined by claim 6; and
   bonding an opposed substrate to the substrate and encapsulating the organic EL elements in a space between the substrate and the opposed substrate.

10. An organic EL element comprising:
    a first electrode, the first electrode being transparent and conductive;
    a second electrode; and
    an organic EL multilayer film disposed between the first electrode and the second electrode;
    wherein the second electrode has an interface with the organic EL multilayer film, the second electrode is entirely made of a black material including a nitrogen-aluminum compound, and the second electrode includes a laminated structure including the interface film forming the interface with the organic EL multilayer film and a conductive film having a higher conductivity than the interface film, or the second electrode includes a structure with nitrogen contents sequentially changed from the interface film toward the conductive film, and
    the nitrogen-aluminum compound has a nitrogen content of from 10 to 25 atomic %.

* * * * *